United States Patent
Stehning et al.

(10) Patent No.: US 8,929,626 B2
(45) Date of Patent: Jan. 6, 2015

(54) RF ANTENNA ARRANGEMENT AND METHOD FOR MULTI NUCLEI MR IMAGE RECONSTRUCTION INVOLVING PARALLEL MRI

(75) Inventors: Christian Stehning, Hamburg (DE); Jurgen Rahmer, Hamburg (DE); Peter Boernert, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 219 days.

(21) Appl. No.: 13/576,742

(22) PCT Filed: Feb. 4, 2011

(86) PCT No.: PCT/IB2011/050483
§ 371 (c)(1),
(2), (4) Date: Aug. 2, 2012

(87) PCT Pub. No.: WO2011/101767
PCT Pub. Date: Aug. 25, 2011

(65) Prior Publication Data
US 2012/0308111 A1    Dec. 6, 2012

(30) Foreign Application Priority Data
Feb. 22, 2010 (EP) .................................... 10154223

(51) Int. Cl.
*G06K 9/00* (2006.01)
*G01R 33/36* (2006.01)
*G01R 33/3415* (2006.01)
*G01R 33/48* (2006.01)
*G01R 33/561* (2006.01)

(52) U.S. Cl.
CPC ........ *G01R 33/3635* (2013.01); *G01R 33/3415* (2013.01); *G01R 33/4828* (2013.01); *G01R 33/5611* (2013.01)
USPC ........................................................ 382/128

(58) Field of Classification Search
USPC .................................................. 382/128–134
See application file for complete search history.

(56) References Cited

U.S. PATENT DOCUMENTS

| 4,799,016 A | 1/1989 | Rezvani |
| 5,041,790 A | 8/1991 | Tropp et al. |

(Continued)

FOREIGN PATENT DOCUMENTS

| WO | 2006137026 A2 | 12/2006 |
| WO | 2008001326 A1 | 1/2008 |

OTHER PUBLICATIONS

Adriany, G., et al.; A Half-Volume Coil for Efficient Proton Decoupling in Humans at 4 Tesla; 1997; Journal of Magnetic Resonance; 125:178-184.

(Continued)

*Primary Examiner* — Alex Liew

(57) ABSTRACT

A multi nuclei RF antenna arrangement for use in a multi nuclei MRI system or an MR scanner, for transmitting RF excitation signals ($B_1$ field) for exciting nuclear magnetic resonances (NMR), and/or for receiving NMR relaxation signals for multi nuclei MR (magnetic resonance) image reconstruction is disclosed, wherein the RF antenna arrangement is tuned to the Larmor frequencies of at least two different species of nuclei having at least two different gyromagnetic rations like $^1H$, $^{14}N$, $^{31}P$, $^{13}C$, $^{23}Na$, $^{39}K$, $^{17}O$ and hyper polarized gases like $^{129}Xe$ or other isotopes having a nuclear spin. Further, a method for reconstructing a multi nuclei MR image especially by means of the above RF antenna arrangement is disclosed. The method involves reducing back-folding artifacts of the species having the higher gyromagnetic ration by parallel MRI reconstruction.

15 Claims, 1 Drawing Sheet

(56) References Cited

U.S. PATENT DOCUMENTS

| | | | |
|---|---|---|---|
| 5,064,638 A | 11/1991 | Moore et al. | |
| 5,194,811 A | 3/1993 | Murphy-Boesch et al. | |
| 6,505,063 B2* | 1/2003 | Van Den Brink et al. | 600/411 |
| 6,856,314 B2* | 2/2005 | Ng | 345/421 |
| 7,020,509 B2* | 3/2006 | Heid | 600/410 |
| 7,123,012 B2 | 10/2006 | Srinivasan | |
| 7,245,752 B2* | 7/2007 | Oesingmann | 382/128 |
| 7,308,125 B2* | 12/2007 | Atkinson | 382/131 |
| 7,558,414 B2* | 7/2009 | Griswold | 382/128 |
| 2004/0114791 A1* | 6/2004 | Atkinson | 382/131 |
| 2005/0129294 A1* | 6/2005 | Donskoy et al. | 382/128 |
| 2007/0219740 A1* | 9/2007 | Wilson et al. | 702/85 |
| 2008/0154119 A1* | 6/2008 | Lewin et al. | 600/410 |
| 2008/0157770 A1 | 7/2008 | Peshkovsky | |
| 2008/0287781 A1* | 11/2008 | Revie et al. | 600/426 |
| 2009/0092303 A1* | 4/2009 | Griswold et al. | 382/131 |
| 2009/0118611 A1 | 5/2009 | He | |
| 2009/0136104 A1* | 5/2009 | Hajian et al. | 382/128 |
| 2009/0160442 A1 | 6/2009 | Mazurkewitz et al. | |
| 2012/0308111 A1* | 12/2012 | Stehning et al. | 382/131 |

OTHER PUBLICATIONS

Gonen, O., et al.; Simultaneous and Interleaved Multinuclear Chemical-Shift Imaging, a Method for Concurrent, Localized Spectroscopy; 1994; Journal of Magnetic Resonance, Series B; 104(1)26-33.

Lee, S. W., et al.; A multinuclear magnetic resonance imaging technique-simultaneous proton and sodium imaging; 1986; Magnetic Resonance Imaging; vol. 4:343-350.

Pruessmann, K. P., et al.; SENSE: Sensitivity Encoding for Fast MRI; 1999; MRM; 42:952-962.

Tropp, J., et al.; Multi-Coil Metabolic Imaging, with SENSE reconstruction, of Hyperpolarized [1-13C] Pyruvate in a Live Rat at 3.0T; 2009; Proc. Intl. Soc. Mag. Reson. Med.; 17:2424.

Ouwerkerk, R., et al.; Tissue Sodium Concentration in Human Brain Tumors as Measured with 23Na MR Imaging; 2003; Radiology; 227:529-537.

Wells, G. D., et al.; Skeletal Muscle Metabolic Dysfunction in Obesity and Metabolic Syndrome; 2008; The Canadian Journal of Neurological Sciences; 35:31-40.

Leussler, C.; Multi Nuclear SENSE/Synergy RF Coil Array for MRI; 2002; ip.com Prior Art Database No. IPCOM000008703D. www.ip.com.

\* cited by examiner

US 8,929,626 B2

RF ANTENNA ARRANGEMENT AND METHOD FOR MULTI NUCLEI MR IMAGE RECONSTRUCTION INVOLVING PARALLEL MRI

FIELD OF THE INVENTION

The invention relates to a multi nuclei RF antenna arrangement for use in a multi nuclei MRI (magnetic resonance imaging) system or MR (magnetic resonance) scanner, for also transmitting RF excitation signals ($B_1$ field) for exciting nuclear magnetic resonances (NMR), and/or for receiving NMR relaxation signals, wherein the RF antenna arrangement is tuned to the Larmor frequencies of at least two different species of nuclei having at least two different gyromagnetic ratios (i.e. "multi nuclei") like $^1$H, $^{14}$N, $^{31}$P, $^{13}$C, $^{23}$Na, $^{39}$K, $^{17}$O and hyperpolarized gases like $^{129}$Xe or other isotopes having a nuclear spin. Further, the invention relates to an MR image reconstruction unit, comprising such an RF antenna arrangement, for use in a multi nuclei MRI system or an MR scanner, for multi nuclei MR image reconstruction. Finally, the invention relates to a method for reconstructing a multi nuclei MR image especially by means of the above RF antenna arrangement, and a multi nuclei MRI system or MR scanner comprising the above RF antenna arrangement and/or MR image reconstruction unit.

BACKGROUND OF THE INVENTION

In an MRI system or MR scanner, an examination object, usually a patient, is exposed to a uniform main magnetic field ($B_0$ field) so that the magnetic moments of the nuclei within the examination object tend to rotate around the axis of the applied $B_0$ field (Larmor precession) with a certain net magnetization of all nuclei parallel to the $B_0$ field. The rate of precession is called Larmor frequency which is dependent on the specific physical characteristics of the involved nuclei, namely their gyromagnetic ratio, and the strength of the applied $B_0$ field. The gyromagnetic ratio is the ratio between the magnetic moment and the spin of a nucleus.

By transmitting an RF excitation pulse ($B_1$ field) which is orthogonal to the $B_0$ field, generated by means of an RF transmit antenna, and matching the Larmor frequency of the nuclei of interest, the spins of the nuclei are excited and brought into phase, and a deflection of their net magnetization from the direction of the $B_0$ field is obtained, so that a transversal component in relation to the longitudinal component of the net magnetization is generated.

After termination of the RF excitation pulse, the relaxation processes of the longitudinal and transversal components of the net magnetization begin, until the net magnetization has returned to its equilibrium state. MR relaxation signals which are emitted by the transversal relaxation process, are detected by means of an MR/RF receive antenna.

The received MR signals which are time-based amplitude signals, are Fourier transformed to frequency-based MR spectrum signals and processed for generating an MR image of the nuclei of interest within an examination object. In order to obtain a spatial selection of a slice or volume within the examination object and a spatial encoding of the received MR signals emanating from the slice or volume of interest, gradient magnetic fields are superimposed on the $B_0$ field, having the same direction as the $B_0$ field, but having gradients in the orthogonal x-, y- and z-directions. Due to the fact that the Larmor frequency is dependent on the strength of the magnetic field which is imposed on the nuclei, the Larmor frequency of the nuclei accordingly decreases along and with the decreasing gradient (and vice versa) of the total, superimposed $B_0$ field, so that by appropriately tuning the frequency of the transmitted RF excitation pulse (and by accordingly tuning the resonance frequency of the MR/RF receive antenna), and by accordingly controlling the gradient fields, a selection of nuclei within a slice at a certain location along each gradient in the x-, y- and z-direction, and by this, in total, within a certain voxel of the object can be obtained.

The above RF (transmit and/or receive) antennas are known both in the form of so-called MR body coils (also called whole body coils) which are fixedly mounted within an examination space of an MRI system for imaging a whole examination object, and as so-called MR surface coils which are directly arranged on a local zone or area to be examined and which are constructed e.g. in the form of flexible pads or sleeves or cages (head coil or birdcage coil).

As to the shape of the examination space, two types of MRI systems or MR scanners can be distinguished. The first one is the so-called open MRI system (vertical system) which comprises an examination zone, which is located between the ends of a vertical C-arm arrangement. The second one is an MRI system, also called axial MRI system, which comprises a horizontally extending tubular or cylindrical examination space.

U.S. Pat. No. 4,799,016 discloses a dual frequency NMR surface coil having a first cylindrical cage coil which is caused to resonate at a lower RF frequency, and a second cylindrical cage coil which is caused to resonate at a higher RF frequency, wherein both cage coils surround a common region of interest along a central axis, and the lower RF frequency is the Larmor frequency of phosphorus and the higher RF frequency is the Larmor frequency of hydrogen. By this, two separate NMR signals from the two different species of nuclei can be received and displayed for the same examination object.

SUMMARY OF THE INVENTION

Magnetic resonance imaging of different species of nuclei, especially of water protons for imaging the tissue of an examination object, together with other nuclei like $^{14}$N, $^{31}$P, $^{13}$C, $^{23}$Na, $^{39}$K, $^{17}$O, and hyperpolarized gases like $^{129}$Xe has been proven to be a powerful means for diagnosing tissue damage and monitoring of tissue viability and function. For instance, MR imaging of sodium ($^{23}$Na) has been revealed as an appropriate means for the assessment of loss of cell integrity in the human brain. MR imaging of phosphorus ($^{31}$P) has been revealed to allow studying musculoskeletal disease. Other nuclei such as fluorine ($^{19}$F), which are intrinsically not present in the human body, may be used as a sensitive marker for micromolecules, drugs, or stem cells. In these and other cases, a simultaneous MR imaging especially of the conventional water proton MR image together with at least one of the other above mentioned specific nuclei is desirable for e.g. navigation, motion-correction, and for mapping the distribution of the related specific nuclei onto the patient's anatomy.

However, the gyromagnetic ratios ("gammas") and consequently the Larmor frequencies of the above nuclei may differ from each other by a large scale. According to certain MR image reconstruction techniques, this may result in different fields of view (FOV) for the respective MR images of the individual nuclei distributions. At given main and gradient magnetic field strengths, the encoded FOV is given by the relationship:

$$FOV = \frac{2\pi}{\gamma \cdot \int_0^{T_P} G_P(t)\,dt}$$

where $G_p(t)$ denotes the time-variant phase encoding gradient magnet field, $T_P$ is the total duration of the applied phase encoding gradient magnet field, and $\gamma$ is the gyromagnetic ratio of the respective nucleus. In simultaneous multi nuclei MR imaging, all involved nuclei are intrinsically exposed to identical gradient magnet fields $G_P(t)$. Therefore, the individual gyromagnetic ratio of each involved nucleus results in a different field of view (FOV).

For example, a low gyromagnetic ratio of e.g. $^{23}$Na results in a comparatively large FOV, whereas a higher gyromagnetic ratio of e.g. $^1$H results in a comparatively small FOV. This has the consequence, that in case of a simultaneous MR measurement or imaging of such different nuclei ("multi nuclei"), severe back-folding artifacts may be introduced especially in the image of the nuclei having the higher gyromagnetic ratio, especially if the comparatively smaller encoded FOV is insufficient to cover the spatial extent of the respective nuclei distribution in the region of interest of the object in the MR imaging apparatus.

One object underlying the invention is to find a solution for this problem, i.e. to enable an MR measurement or MR image reconstruction of species of nuclei having different gyromagnetic ratios ("multi nuclei") but preferably using the same gradient magnet fields for all nuclei, without causing undesired back-folding artifacts for any of the involved nuclei or other disturbances in the common MR image.

Another object underlying the invention is to provide an RF antenna arrangement and a method and unit for multi nuclei MR image reconstruction, by means of which an MR image can be generated simultaneously for at least two different species of nuclei having different gyromagnetic ratios as exemplarily mentioned above without causing undesired back-folding artifacts in the common MR image.

Another object underlying the invention is to provide an RF antenna arrangement and a method and unit for multi nuclei MR image reconstruction, for simultaneously generating an MR image of water protons and of at least one of the above mentioned other species of nuclei, without introducing undesired back-folding artifacts in neither the water proton image nor the image of the other species of nucleus.

These objects are solved according to claim 1 by a multi nuclei RF antenna arrangement comprising a first antenna for transmitting RF excitation signals for exciting magnetic resonances and/or for receiving MR relaxation signals of/from a first species of nuclei having a first gyromagnetic ratio ($\gamma_{LO}$), and a second antenna for transmitting RF excitation signals for exciting magnetic resonances and/or for receiving MR relaxation signals of/from a second species of nuclei having a second gyromagnetic ratio ($\gamma_{HI}$), wherein the first gyromagnetic ratio ($\gamma_{LO}$) is lower than the second gyromagnetic ratio ($\gamma_{HI}$) and wherein the first antenna has a first number ($n_{LO}$) of antenna elements and the second antenna has a second number ($n_{HI}$) of antenna elements, which antenna elements are each resonant to the related Larmor frequency of the first and the second species of nuclei, respectively, wherein the ratio between the second and the first number ($n_{HI}/n_{LO}$) is approximately equal or equal to or greater than the ratio between the second and the first gyromagnetic ratio ($\gamma_{HI}/\gamma_{LO}$).

By means of this RF antenna arrangement, the RF excitation signals which are transmitted and/or the MR relaxation signals which are received, both by the second antenna, are spatial sensitivity encoded due to the greater number of antenna elements of the second antenna in relation to the first antenna, so that, in short, e.g. by reconstructing an MR image of the second species of nuclei by means of the known PARALLEL IMAGING (sensitivity encoding) technique, the field of view of the second antenna can be extended at least substantially to the extent of the field of view of the first antenna.

Generally, the number of antenna elements of the second antenna is greater than the number of antenna elements of the first antenna, and the antenna elements of the second antenna are at least substantially spatially distributed in or throughout the antenna characteristic or sensitivity region of the first antenna in total, i.e. the common antenna characteristic or sensitivity region of the antenna elements of the first antenna, so that even more different information about the distribution of the related second species of nuclei within the examination object (or its region of interest) and accordingly an increased (spatial) sensitivity profile of the second antenna is obtained. The sensitivity region of the antenna at issue is the region from which the antenna (in receiver mode) is sensitive to magnetic resonance signals. Vice versa, a desired spatial sensitivity encoding of the transmitted and/or received RF/MR signals can be obtained by an appropriate spatial distribution of the antenna elements of the second antenna in a spatial relation to the first antenna. Also an increased size or an adapted shape of the antenna elements of the second antenna in relation to the size and shape of the antenna elements of the first antenna can be used additionally to the above distribution in order to obtain the desired increased sensitivity profile of the second antenna. However, preferably, the sizes and shapes of the antenna elements of both antennas are selected according to the prior art for obtaining the desired RF/MR resonance characteristics. The sensitivity profile describes the spatial dependence of the sensitivity of the antenna, i.e. the level of sensitivity of the antenna as a function of position in the sensitivity region.

Further, the objects are solved according to claim 11 by a method for reconstructing a multi nuclei MR image of the distribution of a first and a second species of nuclei in an examination object from MR relaxation signals which are received by the above RF antenna arrangement, especially by means of the known Parallel Imaging technique, such as e.g., SENSE auto-SENSE, SMASH, GRAPPA etc. Generally Parallel Imaging involves undersampling of scanning k-space in the acquisition of the magnetic resonance and unfold the aliased signals on the basis of the sensitivity profiles of the antennas. In this case, in order to prevent backfolding artifacts in the generated MR image, especially if the examination object or the region of interest is greater than the resulting fields of view of the antennas, the Parallel Imaging factor R (i.e. the degree of undersampling) is preferably selected to be equal to or greater than the ratio between the second and the first gyromagnetic ratio ($\gamma_{HI}/\gamma_{LO}$). Vice versa, if the examination object or the region of interest is smaller than the fields of view of the antennas, the Parallel Imaging factor R could also be selected to be smaller than the above ratio. Consequently, the RF antenna arrangement according to the invention is preferably used in combination with an MR image reconstruction unit for reconstructing a multi nuclei MR image by means of the Parallel Imaging technology.

According to claim 14, this method is preferably conducted by means of a computer program.

Another advantage of these solutions is that the same gradient magnet fields can be used for all species of nuclei, so that a simultaneous MR imaging of all species of nuclei is enabled.

The dependent claims disclose advantageous embodiments of the invention.

It will be appreciated that features of the invention are susceptible to being combined in any combination without departing from the scope of the invention as defined by the accompanying claims.

Further details, features and advantages of the invention will become apparent from the following description of preferred and exemplary embodiments of the invention which are given with reference to the drawings.

DETAILED DESCRIPTION OF EMBODIMENTS

Figure 1:
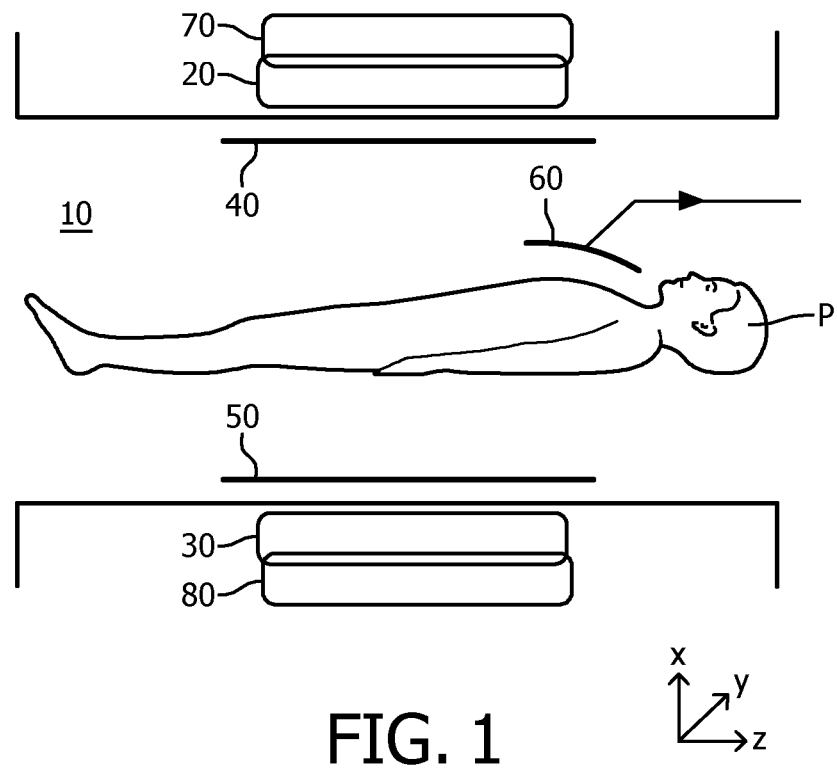
FIG. 1 shows a diagrammatic side elevation of an MRI system.

FIG. 1 shows substantial components of a magnetic resonance imaging (MRI) system or a magnetic resonance (MR) scanner comprising an RF transmit and/or receive antenna according to the invention. In FIG. 1, a vertical (open) system is shown having an examination zone 10 between the upper and the lower end of a C-arm structure.

Above and underneath the examination zone 10 there are provided respective main magnet systems 20, 30 for generating an essentially uniform main magnetic field ($B_0$ field) for aligning the nuclear spins in the object to be examined. For a multi nuclei MRI system, the magnetic flux density (magnetic induction) should be in the order of magnitude of some Tesla, e.g. at least about 3 Tesla, because the MR relaxation signals of the nuclei other that $^1H$ are comparatively weak due to their usually low density within the examination object. The main magnetic field essentially extends through a patient P in a direction perpendicular to the longitudinal axis of the patient P (that is, in the x direction).

Generally, a planar or at least approximately planar RF transmit antenna arrangement 40 (especially in the form of RF surface resonators) serves to generate the RF transmit excitation pulses ($B_1$ field) at the MR frequencies, said RF transmit antenna arrangement 40 being located at or on at least one of the magnet systems 20, 30. A planar or at least approximately planar RF receive antenna arrangement 50 serves to receive subsequent MR relaxation signals from the related nuclei. This RF antenna arrangement may also be formed by RF surface resonators arranged at or on at least one of the magnet systems 20, 30. At least one common RF/MR antenna arrangement, especially an RF surface resonator, can also be used both for the RF pulse transmission and the reception of MR signals if it is suitably switched over between transmitting and receiving, or the two RF antenna arrangements 40, 50 can both serve for the alternating transmission of RF pulses and the reception of MR signals in common.

Furthermore, electrical accessory devices or auxiliary equipments are provided for given examinations. Such a device is, for example, an RF receive antenna in the form of an MR local or surface coil 60 which is used in addition or as an alternative to the permanently build-in planar RF receive antenna 50 (i.e. body coil) and which is arranged directly on the patient P or the zone or specific region of the object to be examined. Such an RF/MR surface coil 60 is preferably constructed as a flexible pad or a sleeve or a cage and can comprise or be provided in the form of an RF transmit and/or receive antenna arrangement for transmitting an RF excitation pulse and/or for receiving MR relaxation signals according to the invention.

At least one of the above RF transmit and/or receive antenna arrangements 40, 50, 60 (i.e. whole body or local RF antenna arrangements) can be provided in the form of an RF antenna arrangement according to the invention.

Finally, for the spatial selection and spatial encoding of the received MR relaxation signals emanating from the nuclei, there is also provided a plurality of gradient magnetic field coils 70, 80 by which three gradient magnetic fields in the orthogonal x-, y- and z-directions are generated as explained above.

The above and the following principles and considerations are also applicable in case of an axial or horizontal MRI system in which a patient or another examination object is guided in an axial direction through the cylindrical or tubular examination space 10. The shapes and dimensions of the magnets and the RF transmit and/or receive antenna arrangements according to the invention are adapted to the shape of the cylindrical or tubular examination space in a known manner.

A multi nuclei RF antenna arrangement according to the invention is preferably used for receiving MR relaxation signals only, whereas for transmitting RF excitation signals, preferably another RF antenna arrangement for example in the form of a whole body coil is used. However, the RF antenna arrangement according to the invention can also be used for transmitting RF excitation signals, and the following explanations which are given for an RF receive antenna arrangement as an illustrative example only, are applicable for an RF transmit antenna arrangement accordingly.

Generally, an RF antenna arrangement according to the invention comprises at least two antennas, wherein each one antenna is tuned with respect to its resonance frequency to the Larmor frequency of each one species of nuclei, i.e. nuclei having the same gyromagnetic ratio (or only slightly different gyromagnetic ratios for which the resulting differences in the fields of view can be tolerated and no considerable backfolding artifacts occur in case of a simultaneous MR imaging of such nuclei).

Further, each antenna can have one or more antenna elements, i.e. conductor structures or segments like coils or coil elements which are each resonant for the respective Larmor frequency, and which are preferably provided each with own electronic RF/MR receive (or transmit and/or receive) units like MR receivers (or transmitters and/or receivers) as generally known, so that a plurality of independently operable RF receive (or transmit and/or receive) channels is provided.

More specifically, an RF antenna arrangement according to the invention comprises a first antenna which is provided for receiving MR relaxation signals from a first species of nuclei having a first gyromagnetic ratio and consequently a first Larmor frequency, and at least a second antenna which is provided for receiving MR relaxation signals from another species of nuclei having a second gyromagnetic ratio and consequently a second Larmor frequency. Further, it is assumed that the second gyromagnetic ratio is higher than the first gyromagnetic ratio, so that the field of view of the second antenna for the second species of nuclei is smaller than the field of view of the first antenna for the first species of nuclei. A third and further antennas can accordingly be provided for receiving MR relaxation signals from species of nuclei having other gyromagnetic ratios which are especially assumed to be higher than the first gyromagnetic ratio. The second antenna (and accordingly the third antenna etc., if present) is provided with a number of antenna elements, which are each resonant to the second Larmor frequency.

Generally, the first and the second antenna (and consequently also the antenna elements of the second antenna) are arranged in a known manner such that they can excite nuclear magnetic resonances and/or receive MR relaxation signals in/from the object or a region of the object of interest. Preferably, the antenna elements of the second antenna are distributed with respect to their positioning or location throughout at least a part of the antenna characteristic (sensitivity field) of the first antenna. This distribution is preferably uniform, so that the antenna elements have e.g. at least substantially equal distances form each other. The antenna elements of the second antenna can overlap each other or they are positioned adjacent to each other with or without overlapping.

Further, the first and the second antenna are preferably each provided in the form of coils or coil arrangements or other planar conductor structures which extend in a two dimensional plane. In such a case, the first and the second antenna is preferably arranged in the same plane or in planes which are parallel to each other. The antenna elements of the second antenna are preferably also coils or parts of a coil or another conductor structure and are arranged in a common plane which is preferably parallel to the plane in which the conductor structures of the first antenna extend.

However, the antennas of the RF antenna arrangement according to the invention can also be provided in the form of cylindrical coils, especially for use in an axial MRI system, wherein the first antenna and the second antenna are preferably positioned in a coaxial arrangement in relation to each other, at least partially surrounding each other in an axial and/or a circumferential direction, and surrounding the examination space. In such a case the conductor structures of the antenna elements of the first and the second antenna are accordingly arranged each on a curved surface of a cylinder, wherein the cylinders have different diameters.

The number of antenna elements of the second antenna and preferably at least one of their individual positioning with respect to their location in relation to the first antenna and their dimensioning with respect to their size and/or the size of the second antenna itself is/are selected such that a sufficiently large spatial sensitivity encoding of the MR relaxation signals from all locations or regions within the object or the region of interest of the object is obtained for the second nuclei, and that by an MR image reconstruction (which is conducted by means of the MR image reconstruction unit) on the basis of the (spatial) sensitivity encoded MR relaxation signals received by all antenna elements of the second antenna (PARALLEL IMAGING reconstruction), the resulting total field of view of the second antenna can be spatially extended preferably at least substantially to the extent of the field of view of the first antenna, both throughout the object or the region of interest of the object in the MR imaging apparatus.

The number of antenna elements in each antenna is selected considering the differences in the gyromagnetic ratios of the species of nuclei because the greater this difference is, the greater is also the difference between the extensions of the resulting fields of view of both antennas in case that one common antenna for both species of nuclei would be used.

Generally, it has revealed that in case of two antennas (namely the first and the second antenna), the ratio of the number of antenna elements between both antennas is preferably at least proportional to (especially approximately equal to or greater than) the ratio of the gyromagnetic ratios of both species of nuclei, preferably multiplied by a phase encoding dimension DIM of the MR image generation:

$$\frac{n_{HI}}{n_{LO}} \geq DIM \cdot \frac{\gamma_{HI}}{\gamma_{LO}}$$

wherein $n_{HI}$ denotes the number of coil elements for the (second) antenna which is provided for detecting MR excitation signals from nuclei having a high gyromagnetic ratio (which results in a smaller field of view) and $n_{LO}$ denotes the number of coil elements for the (first) antenna which is provided for detecting MR excitation signals from nuclei having a low gyromagnetic ratio (which results in a larger field of view). Further, DIM denotes the phase encoding dimensions, which is preferably selected to be DIM=1 for a two-dimensional MR image and preferably DIM=2 for a three-dimensional MR image. Finally, $\gamma_{HI}$ denotes the high gyromagnetic ratio and $\gamma_{LO}$ denotes the low gyromagnetic ratio.

Figure 2:
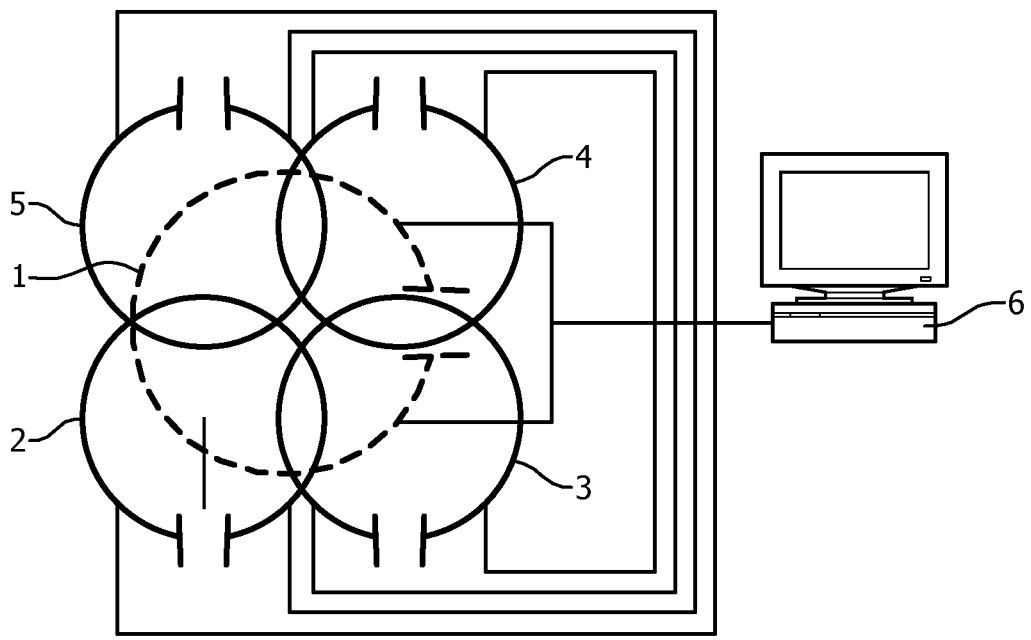
FIG. 2 shows an example of an RF transmit and/or receive antenna arrangement according to the invention.

According to the embodiment shown in FIG. 2, two antennas are provided for two different species of nuclei having such different gyromagnetic ratios and accordingly different encoded fields of view that in case of using only one RF antenna a meaningful simultaneous MR measurement would be inhibited and severe backfolding artifacts in the common MR image would be introduced.

More in detail, according to FIG. 2, a first antenna 1 is used for receiving MR relaxation signals from a first species of nuclei having a first gyromagnetic ratio $\gamma_{LO}$ (for example one of the above mentioned nuclei other than water protons), and a second antenna 2, 3, 4, 5 is provided for receiving MR relaxation signals from a second species of nuclei having a second gyromagnetic ratio $\gamma_{HI}$ (for example water protons), wherein it is assumed that the first gyromagnetic ratio $\gamma_{LO}$ is lower than the second gyromagnetic ratio $\gamma_{HI}$.

In this case, the first antenna is a one element antenna having one antenna element 1 which is preferably provided in the form of one coil, and the second antenna is a multi element antenna having four antenna elements which are preferably each provided in the form of one coil 2, 3, 4, 5.

The antenna elements 2, 3, 4, 5 of the second antenna are arranged along the circumference of the antenna element 1 of the first antenna such that each two antenna elements of the second antenna which are adjacent in the direction of the circumference of the antenna element 1 of the first antenna overlap each other. The antenna elements 2, 3, 4, 5 of the second antenna are preferably arranged such that their overlapping sections are preferably positioned at least substantially within the area which is enclosed by the antenna element 1 of the first antenna.

The time-based MR amplitude signals which are received from the first and the second species of nuclei by the first and the second RF antenna, respectively, and which are spatially encoded by the gradient magnetic fields are submitted to an MR image reconstruction unit 6 for performing the Fourier transformation in order to obtain frequency-based MR spectrum signals for generating an MR image of the related species of nuclei.

As explained above, in order to prevent backfolding artifacts and other disturbances which would be caused by the different gyromagnetic ratios especially in the MR image of the second nuclei, the MR image of the second species of nuclei is reconstructed by means of the MR image reconstruction unit 6 on the basis of both of the spatial encoding of the MR relaxation signals by the gradient magnet fields and of a sensitivity encoding of the MR relaxation signals by the individual antenna elements 2, 3, 4, 5 which have different (spatial) sensitivity profiles due to the fact that they are positioned at (known) different locations and by this provide different information about the distribution of the related species of nuclei within the examination object (or its region of interest). By this MR image reconstruction on the basis of these combined gradient magnet field and sensitivity encoded MR relaxation signals, conducted by the MR image reconstruction unit 6, the field of view of the second antenna is preferably increased to at least substantially the extent of the field of view of the first antenna.

The MR image reconstruction from sensitivity encoded MR signals is disclosed in detail in Pruessmann et al, "SENSE: Sensitivity Encoding for Fast MRI", in Magnetic Resonance in Medicine 42: 952-962 (1999), which by reference shall be made to a part of this disclosure.

By this, a common MR image of for example a tissue ($^1$H protons) of an examination object, in which the distribution of one or more other species of nuclei of interest (for example $^{23}$Na and/or $^{31}$P etc.) is displayed, can be generated without backfolding artifacts or other disturbances.

The MR image reconstruction unit 6 is usually a part of a whole multi nuclei MRI system or MR scanner. Further, the MR image reconstruction as explained above is usually conducted by means of a computer program which preferably additionally conducts the above mentioned Fourier transformation, the gradient magnet field encoding, the SENSE encoding and other processing of the received MR relaxation signals, as well as e.g. the controlling of the generation of the RF transmit signals.

While the invention has been illustrated and described in detail in the drawings and foregoing description, such illustration and description is to be considered illustrative or exemplary and not restrictive, and the invention is not limited to the disclosed embodiments. Variations to the embodiments of the invention described in the foregoing, e.g. with respect to the antenna elements themselves, their shapes and numbers and arrangements in relation to each other, in order to obtain the above explained result of at least substantially identical fields of view for nuclei having substantially different gyromagnetic ratios are possible for a person skilled in the art without departing from the basic principle of the invention as defined by the accompanying claims.

Variations to the disclosed embodiments can be understood and effected by those persons skilled in the art in practicing the claimed invention, from a study of the drawings, the disclosure, and the appended claims. In the claims, the word "comprising" does not exclude other elements or steps, and the indefinite article "a" or "an" does not exclude a plurality. A single unit may fulfill the functions of several items recited in the claims. The mere fact that certain measures are recited in mutually different dependent claims does not indicate that a combination of these measured cannot be used to advantage. Any reference signs in the claims should not be construed as limiting the scope of the claims.

The invention claimed is:

1. A multi nuclei RF antenna arrangement comprising:
    a first antenna for transmitting RF excitation signals for exciting magnetic resonances or for receiving MR relaxation signals from a first species of nuclei having a first gyromagnetic ratio ($\gamma_{LO}$); and
    a second antenna for transmitting RF excitation signals for exciting magnetic resonances or for receiving MR relaxation signals from a second species of nuclei having a second gyromagnetic ratio ($\gamma_{HI}$),
    wherein the first gyromagnetic ratio ($\gamma_{LO}$) is lower than the second gyromagnetic ratio ($\gamma_{HI}$), and
    wherein the first antenna has a first number ($n_{LO}$) of antenna elements and the second antenna has a second number ($n_{HI}$) of antenna elements, which antenna elements are each resonant to the related Larmor frequency of the first and the second species of nuclei, respectively,
    wherein the ratio between the second and the first number ($n_{HI}/n_{LO}$) is approximately equal to or greater than the ratio between the second and the first gyromagnetic ratio ($\gamma_{HI}/\gamma_{LO}$).

2. The multi nuclei RF antenna arrangement according to claim 1, wherein for reconstructing a three-dimensional MR image, the ratio between the second and the first number ($n_{HI}/n_{LO}$) is approximately equal to or greater than the ratio between the second and the first gyromagnetic ratio ($\gamma_{HI}/\gamma_{LO}$), multiplied by a factor 2.

3. The multi nuclei RF antenna arrangement according to claim 1,
    wherein the antenna elements of the first or the second antenna are provided in the form of planar conductor structures.

4. The multi nuclei RF antenna arrangement according to claim 1,
    wherein the antenna elements of the first or the second antenna are provided in the form of coils.

5. The multi nuclei RF antenna arrangement according to claim 1,
    wherein the first antenna is provided by one antenna element in the form of a coil and the second antenna is provided by a number of antenna elements in the form of each a coil which are arranged along the circumference of the antenna element of the first antenna.

6. The multi nuclei RF antenna arrangement according to claim 1,
    wherein the antenna elements of the first and the second antenna are each positioned in a plane, and wherein both planes are parallel to each other or provide one common plane.

7. The multi nuclei RF antenna arrangement according to claim 1,
    wherein the antenna elements of the first and of the second antenna are each positioned on a surface of a cylinder wherein the cylinders are arranged in a coaxial relation to each other.

8. The multi nuclei RF antenna arrangement according to claim 1,
    which is provided in the form of a whole body coil for use in a vertical or an axial MRI system.

9. The multi nuclei RF antenna arrangement according to claim 1,
    which is provided in the form of a surface coil or birdcage coil or breast coil for use in an MRI system.

10. The multi nuclei RF antenna arrangement according to claim 1,
    wherein the first species of nuclei is selected form the group of nuclei comprising $^{14}$N, $^{31}$P, $^{13}$C, $^{23}$Na, $^{39}$K, $^{17}$O and hyperpolarized gases like $^{129}$Xe, and the second species of nuclei are $^1$H nuclei.

11. A method for reconstructing a multi nuclei MR image of the distribution of a first and a second species of nuclei having a first and a second gyromagnetic ratio, respectively, wherein the first gyromagnetic ratio is smaller than the second gyromagnetic ratio, and wherein the MR images of the first and second species of nuclei are reconstructed on the basis of MR relaxation signals which are received by a first and a second antenna, respectively, of a multi nuclei RF antenna arrangement according to claim 1, and wherein the MR image of the second species of nuclei is reconstructed on the basis of spatial sensitivity encoded MR relaxation signals which are received by the antenna elements of the second antenna.

12. The method according to claim 11,
wherein the field of view of the second antenna is extended by the MR image reconstruction on the basis of the sensitivity encoded MR relaxation signals received by the individual antenna elements of the second antenna to at least substantially the extent of the field of view of the first antenna.

13. The method according to claim 11,
wherein the MR imaging of the first and the second species of nuclei is conducted simultaneously in one common MR image.

14. A computer program for reconstructing a multi nuclei MR image, comprising a computer program code adapted to perform a method or for use in a method according to claim 11 when said program is run on a programmable computer.

15. A multi nuclei MR imaging system or MR scanner comprising an RF antenna arrangement according to claim 1.

* * * * *